(12) United States Patent
Journeay et al.

(10) Patent No.: US 10,929,574 B2
(45) Date of Patent: Feb. 23, 2021

(54) INTEGRATED STANDARDIZED METROLOGY SYSTEM (ISMETS)

(71) Applicant: The Boeing Company, Chicago, IL (US)

(72) Inventors: Glen Anthony Journeay, Poulsbo, WA (US); Paul F. Sjoholm, Renton, WA (US); Jonathan Gorman Cook, Jr., Seattle, WA (US); Khanh Quoc Hoang, Federal Way, WA (US)

(73) Assignee: The Boeing Company, Chicago, IL (US)

( * ) Notice: Subject to any disclaimer, the term of this patent is extended or adjusted under 35 U.S.C. 154(b) by 504 days.

(21) Appl. No.: 15/942,269

(22) Filed: Mar. 30, 2018

(65) Prior Publication Data
US 2019/0303529 A1 Oct. 3, 2019

(51) Int. Cl.
*G06F 17/20* (2006.01)
*G06F 30/17* (2020.01)
*B64F 5/10* (2017.01)
*G06F 3/048* (2013.01)
*G06F 16/83* (2019.01)
*G06F 16/11* (2019.01)

(52) U.S. Cl.
CPC .......... *G06F 30/17* (2020.01); *B64F 5/10* (2017.01); *G06F 3/048* (2013.01); *G06F 16/116* (2019.01); *G06F 16/83* (2019.01)

(58) Field of Classification Search
CPC ........ G06F 30/17; G06F 16/83; G06F 16/116; G06F 3/048; B64F 5/10
See application file for complete search history.

(56) References Cited

U.S. PATENT DOCUMENTS

| 8,606,388 | B2 | 12/2013 | Cobb et al. | |
|---|---|---|---|---|
| 8,620,470 | B2 | 12/2013 | Cobb et al. | |
| 2008/0256788 | A1* | 10/2008 | Glazebrook | B64F 5/10 29/700 |
| 2009/0112349 | A1* | 4/2009 | Cobb | B64F 5/10 700/114 |
| 2009/0151143 | A1* | 6/2009 | Jones | B64F 5/10 29/407.1 |
| 2009/0206203 | A1* | 8/2009 | Crawford | B64F 5/10 244/123.7 |

(Continued)

*Primary Examiner* — Shahid K Khan
(74) *Attorney, Agent, or Firm* — Haynes and Boone LLP

(57) ABSTRACT

Systems, methods, and apparatus for an integrated standardized metrology system (ISMetS) are disclosed. A disclosed metrology system comprises at least one processor to receive an XML metrology file that comprises at least one metrology action for a metrology instrument to measure at least one object, to translate the XML metrology file into a human machine interface (HMI) metrology file, to generate a graphical user interface (GUI) based on the HMI metrology file, to generate a HMI metrology command file according to a command from a user via the GUI, to translate the HMI metrology command file into a metrology instrument software command file, and to translate the metrology instrument software command file into a metrology instrument command file. The system further comprises the metrology instrument to measure at least one object, according to the metrology instrument command file, to obtain measurements for at least one object.

20 Claims, 10 Drawing Sheets

(56) References Cited

U.S. PATENT DOCUMENTS

| | | | | |
|---|---|---|---|---|
| 2010/0049354 A1* | 2/2010 | Stark | ............... | B64F 5/10 |
| | | | | 700/110 |
| 2015/0266147 A1* | 9/2015 | Reid | ............... | B21J 15/142 |
| | | | | 29/525.01 |
| 2015/0314890 A1* | 11/2015 | DesJardien | ............... | B25J 11/007 |
| | | | | 212/324 |
| 2016/0008981 A1* | 1/2016 | Oberoi | ............... | B25J 5/007 |
| | | | | 700/166 |

\* cited by examiner

```xml
<MeasurementProcedure Title="Pre-Fasten CIRC-FWD" Number="Pre-Fasten CIRC-FWD" Description="Measures FWD Circumference Profile">
    <Step>
        <Number>1</Number>
        <Title>Initialize System</Title>
        <Description>
*Starting Spatial Analyzer, and loading the geometry XML files.

*If there is any sort of error, please press CANCEL. After the cancel command has completed, please press INITIALIZE to try again.

*If it still won't initialize, please check "System Status" and verify all components are green.

*If the system is still reporting errors, please refer to the engineers for assistance.
        </Description>
        <Display>dspinit</Display>
        <Action Mode="AUTO">INITIALIZE</Action>
        <Command>INITIALIZE|LTON</Command>
    </Step>
    <Step>
        <Number>2</Number>
        <Title>Dock Instrument Panel</Title>
        <Description>
*This step docks the Instrument panel(s) into the SA window. It also hides lines, frames, and performs an auto-scale in the SA window
        </Description>
        <Display>dspinit</Display>
        <Action Mode="AUTO" Label="INITIALIZE">MP</Action>
        <Command>MP|DockInst.mp| </Command>
    </Step>
    <Step>
        <Number>3</Number>
        <Title>Field Check LF</Title>
        <Description>
*Performing a two face field check on the Left Front floor target.

**If the tracker unable to fine floor LF target, verify tracker cable is pointed due AFT and verify line of sight from tracker to target.

***If the system is still reporting errors, please refer to the engineers for assistance.
        </Description>
        <Display>dspinit</Display>
        <Action Mode="AUTO">FIELD CHECK</Action>
        <Command>FIELD CHECK|POS1-1|TwoFace|MBFLR|LF</Command>
    </Step>
```

FIG. 3

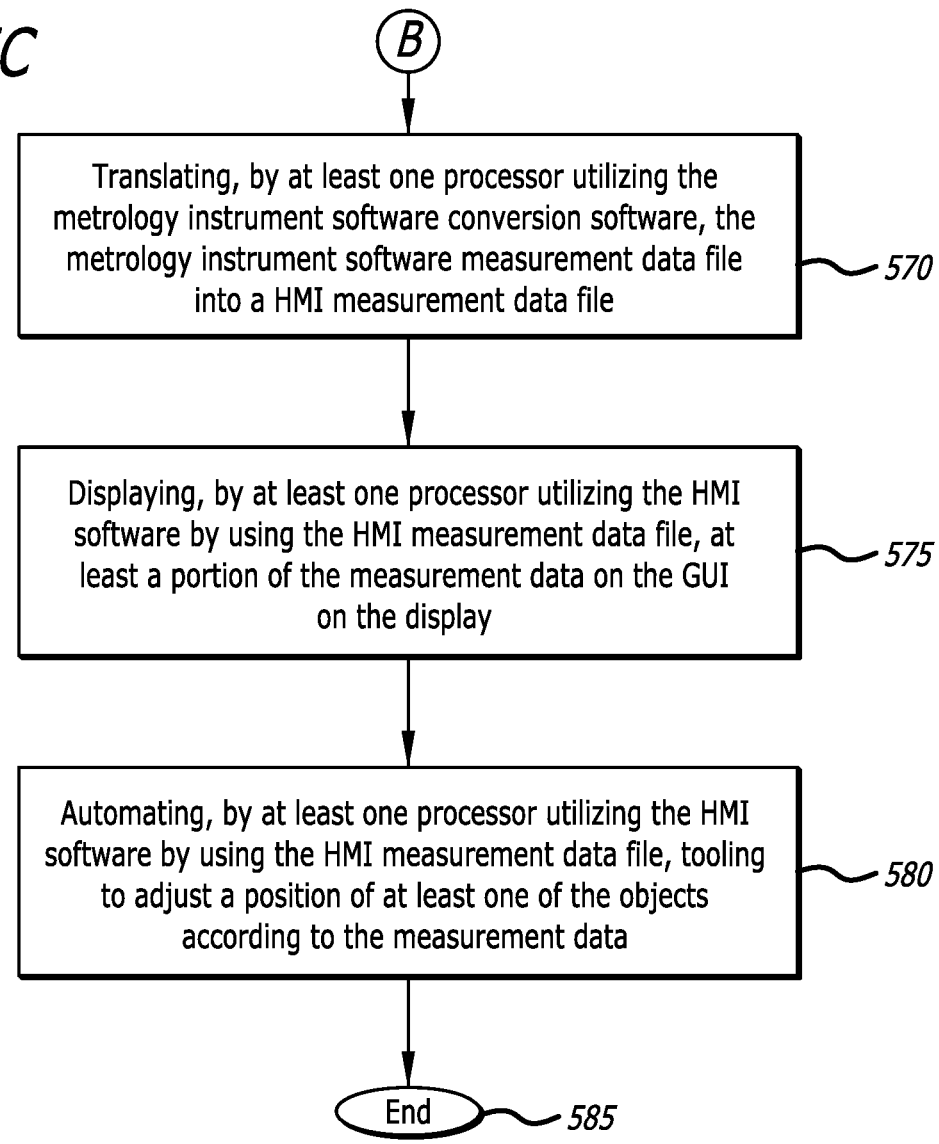

INTEGRATED STANDARDIZED METROLOGY SYSTEM (ISMETS)

FIELD

The present disclosure relates to a metrology system. In particular, it relates to an integrated standardized metrology system (ISMetS).

BACKGROUND

Metrology instruments are commonly used to verify the accuracy of assembly of various different manufactured objects. Laser trackers are metrology instruments that accurately measure objects by determining the positions of optical targets held against those objects. Some examples of laser tracker applications are to align the wings of an aircraft during assembly of the aircraft and to align large machine tools used for manufacturing.

Currently, metrology instruments, such as laser trackers, are typically operated by one large application program for metrology (i.e. measurement) of an object (e.g., an aircraft). If any changes are desired for the operation of the metrology instruments, a large amount of custom coding to the application program is needed, and changes to the application program are often difficult to implement. As such, implementing automation in metrology operations, such as laser tracker operations, are difficult due to the unique software and hardware elements involved that can require timely programming efforts in a dynamic manufacturing environment where parameters frequently change.

There is therefore a need for an improved metrology system that provides an efficient way to dynamically operate metrology instruments in manufacturing environments.

SUMMARY

The present disclosure relates to a method, system, and apparatus for an integrated standardized metrology system (ISMetS). In one or more embodiments, a method for operating a metrology system comprises receiving, by at least one processor, an extensible markup language (XML) metrology file. In one or more embodiments, the XML metrology file comprises at least one metrology action for a metrology instrument to measure at least one object. The method further comprises translating, by at least one processor utilizing human machine interface (HMI) software, the XML metrology file into a HMI metrology file. Also, the method comprises generating, by at least one processor utilizing the HMI software, a graphical user interface (GUI) based on the HMI metrology file. In addition, the method comprises generating, by at least one processor utilizing the HMI software, a HMI metrology command file according to a command from a user via the GUI. Also, the method comprises translating, by at least one processor utilizing metrology instrument software conversion software, the HMI metrology command file into a metrology instrument software command file. In addition, the method comprises translating, by at least one processor utilizing metrology instrument software, the metrology instrument software command file into a metrology instrument command file. Further, the method comprises measuring, by the metrology instrument, at least one object, according to the metrology instrument command file, to obtain measurements for at least one object.

In one or more embodiments, the method further comprises displaying, by at least one processor utilizing the HMI software, the GUI on a display. In some embodiments, the method further comprises receiving, by at least one processor utilizing the HMI software, the command from the user via the GUI to perform at least one of the metrology actions for the metrology instrument.

In at least one embodiment, the method further comprises generating, by the metrology instrument, a metrology results file comprising the measurements for at least one object. In one or more embodiments, the method further comprises generating, by at least one processor utilizing the metrology instrument software, measurement data by using the metrology results file. In at least one embodiment, the measurement data comprises the measurements for at least one object and/or discrepancies between the measurements for at least one object and predetermined nominal measurements for at least one object. In some embodiments, the method further comprises generating, by at least one processor utilizing the metrology instrument software, a quality assurance (QA) report based on the measurement data.

In one or more embodiments, the method further comprises generating, by at least one processor utilizing the metrology instrument software, a metrology instrument software measurement data file based on the measurement data. In at least one embodiment, the method further comprises translating, by at least one processor utilizing the metrology instrument software conversion software, the metrology instrument software measurement data file into a HMI measurement data file. In some embodiments, the method further comprises displaying, by at least one processor utilizing the HMI software by using the HMI measurement data file, at least a portion of the measurement data on the GUI on the display.

In at least one embodiment, the method further comprises automating, by at least one processor utilizing the HMI software by using the HMI measurement data file, tooling to adjust a position of at least one of the objects according to the measurement data.

In one or more embodiments, a metrology system comprises at least one processor operable to receive an extensible markup language (XML) metrology file, where the XML metrology file comprises at least one metrology action for a metrology instrument to measure at least one object. At least one processor is further operable to translate, by utilizing human machine interface (HMI) software, the XML metrology file into a HMI metrology file. Also, at least one processor is operable to generate, by utilizing the HMI software, a graphical user interface (GUI) based on the HMI metrology file. In addition, at least one processor is operable to generate, by utilizing the HMI software, a HMI metrology command file according to a command from a user via the GUI. Additionally, at least one processor is operable to translate, by utilizing metrology instrument software conversion software, the HMI metrology command file into a metrology instrument software command file. Further, at least one processor is operable to translate, by utilizing metrology instrument software, the metrology instrument software command file into a metrology instrument command file. The system further comprises the metrology instrument to measure at least one object, according to the metrology instrument command file, to obtain measurements for at least one object.

In at least one embodiment, at least one processor is further operable to display, by utilizing the HMI software, the GUI on a display. In some embodiments, at least one processor is further operable to receive, by utilizing the HMI software, the command from the user via the GUI to perform at least one of the metrology actions for the metrology instrument.

In one or more embodiments, the metrology instrument is further operable to generate a metrology results file comprising the measurements for at least one object. In some embodiments, at least one processor is further operable to generate, by utilizing the metrology instrument software, measurement data by using the metrology results file. In one or more embodiments, the measurement data comprises the measurements for at least one object and/or discrepancies between the measurements for at least one object and predetermined nominal measurements for at least one object. In some embodiments, at least one processor is further operable to generate, by utilizing the metrology instrument software, a quality assurance (QA) report based on the measurement data.

In at least one embodiment, at least one processor is further operable to generate, by utilizing the metrology instrument software, a metrology instrument software measurement data file based on the measurement data. In some embodiments, at least one processor is further operable to translate, by utilizing the metrology instrument software conversion software, the metrology instrument software measurement data file into a HMI measurement data file. In at least one embodiment, at least one processor is further operable to display, by utilizing the HMI software by using the HMI measurement data file, at least a portion of the measurement data on the GUI on the display.

In one or more embodiments, at least one processor is further operable to automate, by utilizing the HMI software by using the HMI measurement data file, tooling to adjust a position of at least one of the objects according to the measurement data.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

FIG. 1 is a diagram showing an exemplary metrology instrument and exemplary manufactured object that may be employed for the disclosed integrated standardized metrology system (ISMetS), in accordance with at least one embodiment of the present disclosure.

FIGS. 2A, 2B, and 2C are diagrams that together show the details of the disclosed integrated standardized metrology system (ISMetS), in accordance with at least one embodiment of the present disclosure.

FIG. 3 is a diagram showing an exemplary extensible markup language (XML) file that may be employed for the disclosed integrated standardized metrology system (ISMetS), in accordance with at least one embodiment of the present disclosure.

Figure 5A:
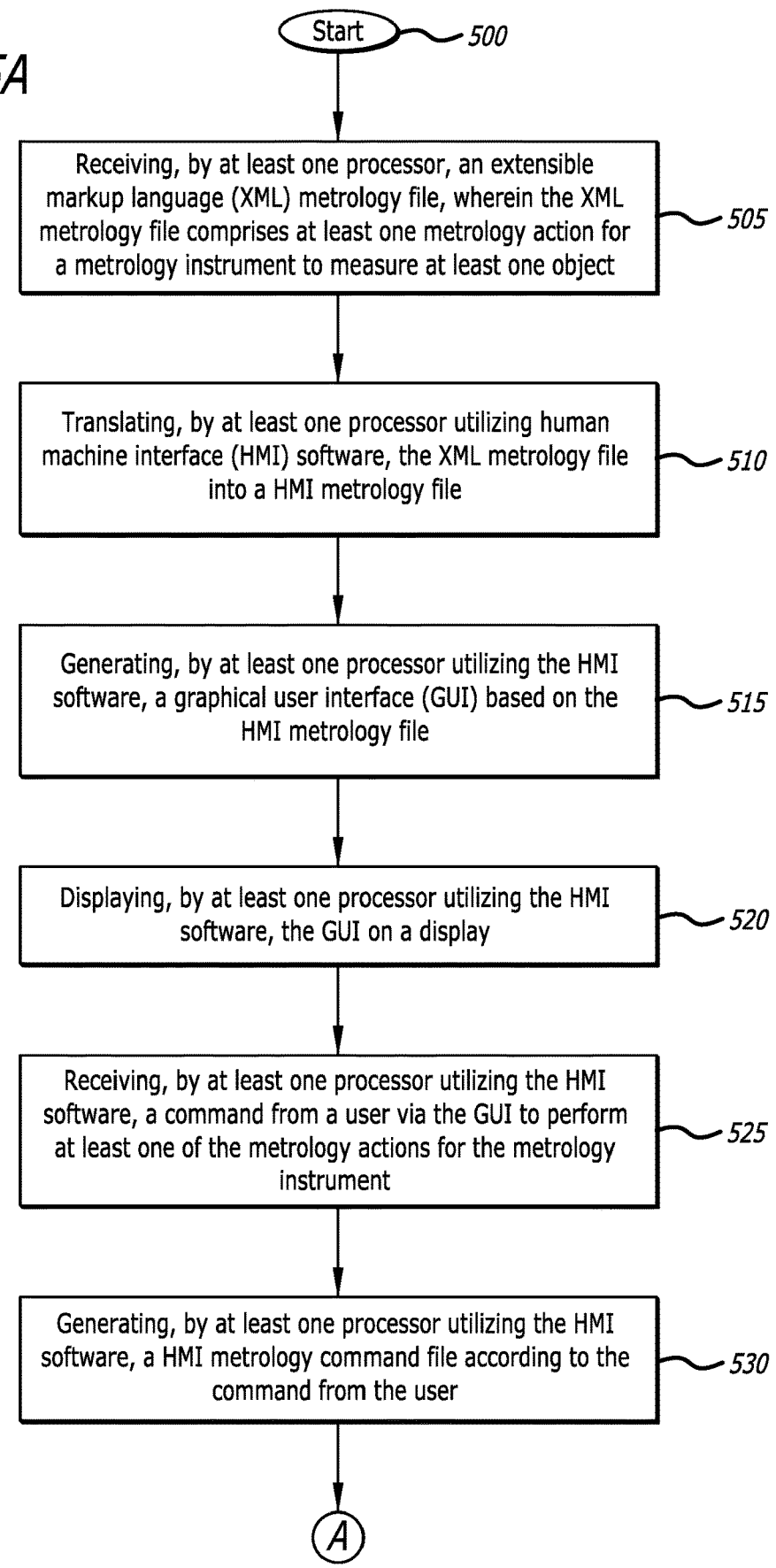
Figure 5B:
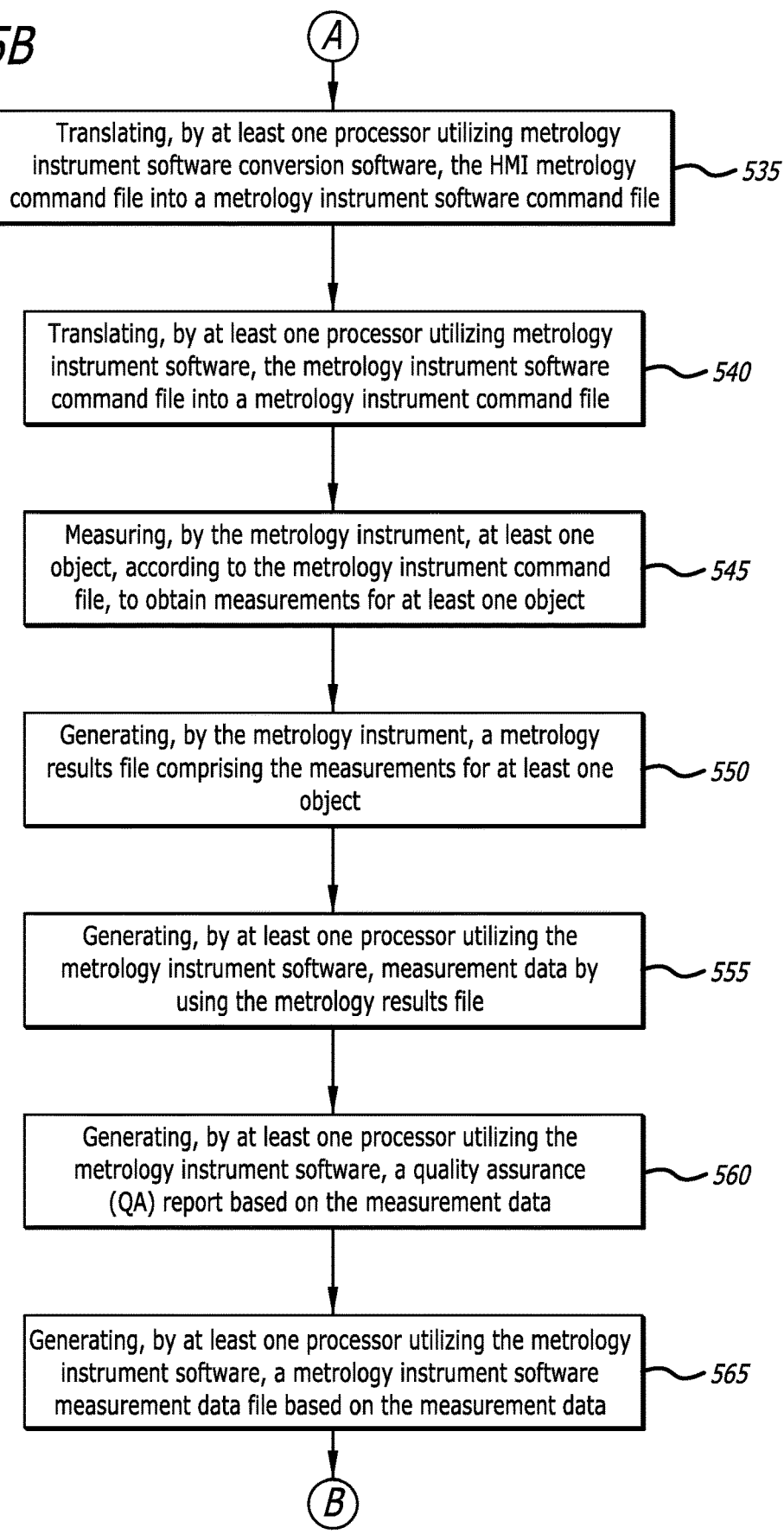

FIGS. 5A, 5B, and 5C together are a flow chart showing the disclosed method for an integrated standardized metrology system (ISMetS), in accordance with at least one embodiment of the present disclosure.

DESCRIPTION

The methods and apparatus disclosed herein provide an integrated standardized metrology system (ISMetS). In one or more embodiments, the system of the present disclosure provides a technology that allows for the isolation of application and metrology equipment (e.g., laser trackers) dependencies to allow for the rapid configuration and deployment of factory automation tools and fixtures. The disclosed system employs standard extensible markup language (XML) data schemas and neutral device drivers to allow for seamless communication of commands and result data, regardless of the measurement technology involved.

As previously mentioned above, metrology instruments are commonly used to verify the accuracy of assembly of various different manufactured objects. Laser trackers are metrology instruments that accurately measure objects by determining the positions of optical targets held against those objects. Some examples of laser tracker applications are to align the wings of an aircraft during assembly of the aircraft and to align large machine tools used for manufacturing.

Currently, metrology instruments, such as laser trackers, are typically operated by one large application program for metrology (i.e. measurement) of an object (e.g., an aircraft). If any changes are desired for the operation of the metrology instruments, a large amount of custom coding to the application program is needed, and changes to the application program are often difficult to implement. As such, implementing automation in metrology operations, such as laser tracker operations, are difficult due to the unique software and hardware elements involved that can require timely programming efforts in a dynamic manufacturing environment where parameters (such as the different products being manufactured and measured, and the variety of measurements to be taken of the products) frequently change.

The system of the present disclosure employs intermediate XML execution files to define a number of different activities performed in measurements taken by metrology instruments (e.g., laser trackers) of components and tooling. The use of the XML files for the metrology process allows for an efficient and faster way to dynamically operate metrology instruments (e.g., to take measurements of products) (as well as to dynamically operate automation tolling (e.g., to move products)) in manufacturing environments. The XML data files are readily editable as compared to the application programming interface (API) of the sensor data analysis software (e.g., metrology instrument software, such as SPATIAL ANALYZER™ software) that commands the metrology instruments. Currently, when changes are needed to be made to the metrology operations, extensive and timely programming to the API are required. By employing the use of the XML data files, the disclosed system provides a quick and efficient way to modify the metrology operations (as well as to modify the automation tooling operations) while in the factory.

In particular, the XML data files include instructions for initializing the measurement system, verifying the position of the metrology instruments, and mating components of tooling structures. The XML files can also include subsequent instructions to operators (e.g., human operators) and to automation tooling (e.g., robotic arms) based on results provided by the data analysis software. The XML data files execute predefined measurements of sequences to be executed by the data analysis software. The sequences are in accordance with the manufacturing plan to fabricate the components. As such, the XML files enable further automation of the metrology process for large scale assembly operations.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the system described herein is merely one example embodiment of the present disclosure.

For the sake of brevity, conventional techniques and components related to metrology systems, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Figure 1:
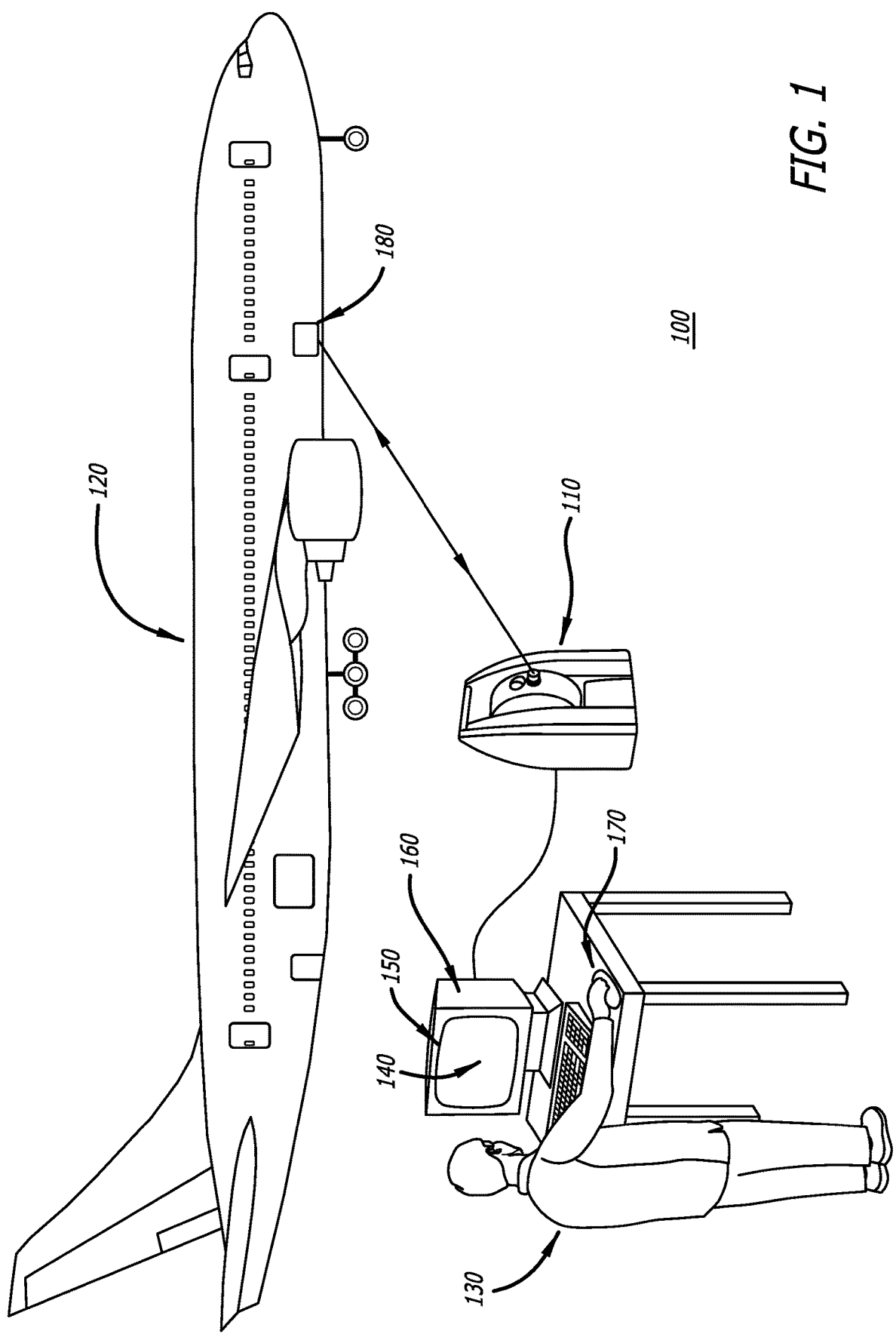

FIG. 1 is a diagram showing an exemplary metrology instrument 110 and exemplary manufactured object 120 that may be employed for the disclosed integrated standardized metrology system (ISMetS) 100, in accordance with at least one embodiment of the present disclosure. In this figure, a mechanic technician (tech) 130 is shown to be operating the disclosed ISMetS 100 by utilizing a graphical user interface (GUI) 140 (e.g., refer to 400 in FIG. 4A) displayed on a display 150 of a metrology human machine interface (HMI) 160 (e.g., a personal computer (PC)). The metrology HMI 160 in this figure is a desktop computer. However, in other embodiments, various different types of computing devices may be employed for the metrology HMI 160 of the disclosed ISMetS 100 other than a desktop computer as is shown in FIG. 1 including, but not limited to, a tablet device, a laptop computer, and a smart phone.

Also in this figure, the ISMetS 100 is shown to include a metrology instrument 110 and a manufactured object 120. The metrology instrument 110 in this figure is a laser tracker. A laser tracker is a metrology instrument that accurately measures objects by determining the positions of optical targets held against those objects. In this figure, the laser tracker metrology instrument 120 is measuring the manufactured object (e.g., an aircraft) 120 by measuring the position of an optical target 180 mounted on the manufactured object 120. It should be noted that various different laser trackers may be employed for the metrology instrument 110 of the disclosed ISMetS 100 including, but not limited to, a Leica Absolute Tracker AT403™, a Leica Absolute Tracker AT930™, and a Leica Absolute Tracker AT960™. In addition, it should be noted that in other embodiments, other types of metrology instruments 110 may be employed for the disclosed ISMetS 100 other than a laser tracker as is shown in FIG. 1 including, but not limited to, a coordinate measuring machine (CMM). A CMM is a device that measures the geometry of physical objects by sensing discrete points on the surface of the object with a probe.

The manufactured object 120 in this figure is an aircraft. It should be noted that various different types of manufactured objects may be employed for the manufactured object 120 of the disclosed ISMetS 100 including, but not limited to, various different types of vehicles (e.g., various different airborne vehicles, various different space vehicles, various different terrestrial vehicles, and various different marine vehicles), various different types of mechanical devices, various different types of structures, and various different types of goods.

Figure 2A:
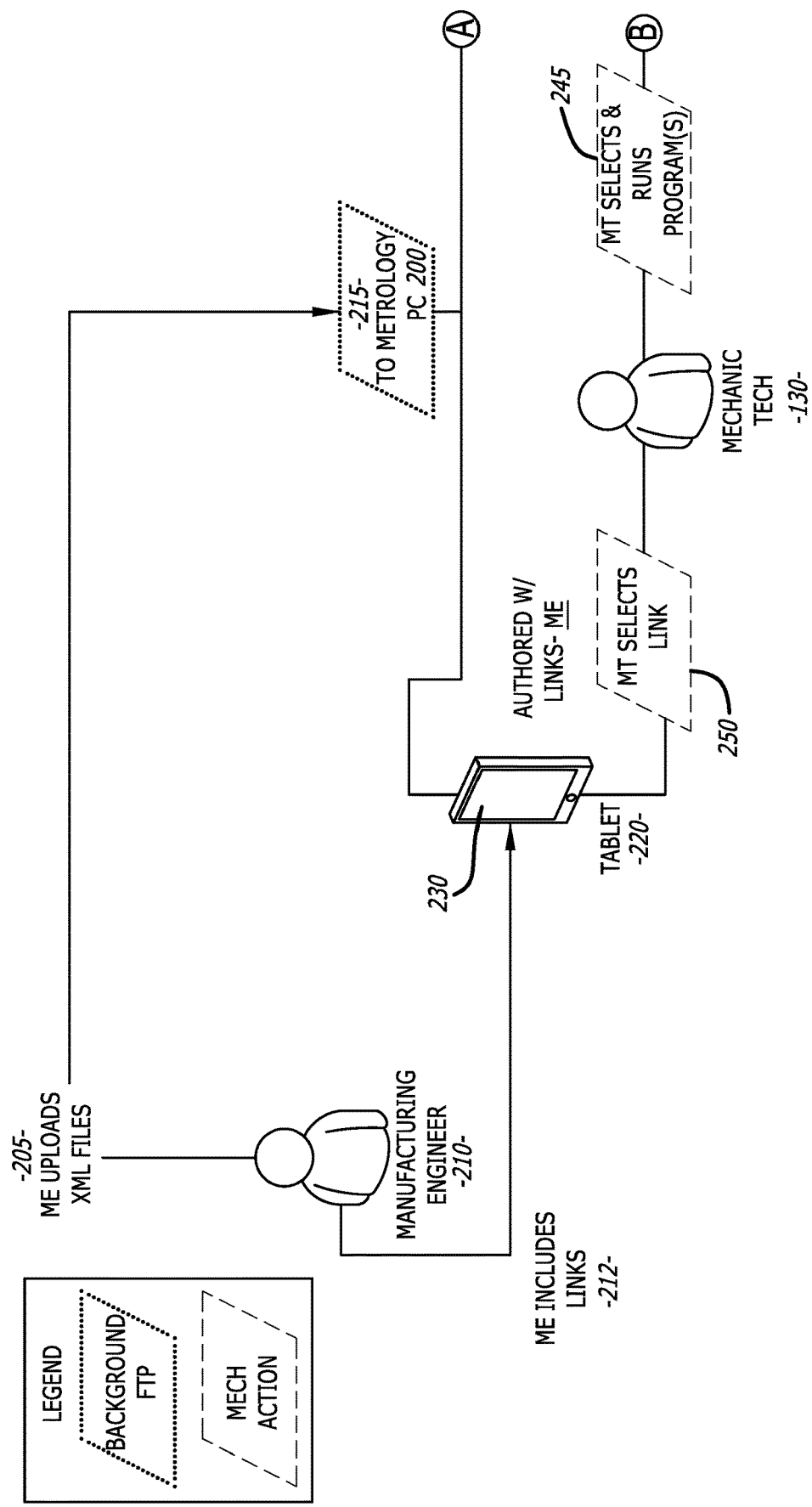
Figure 2B:
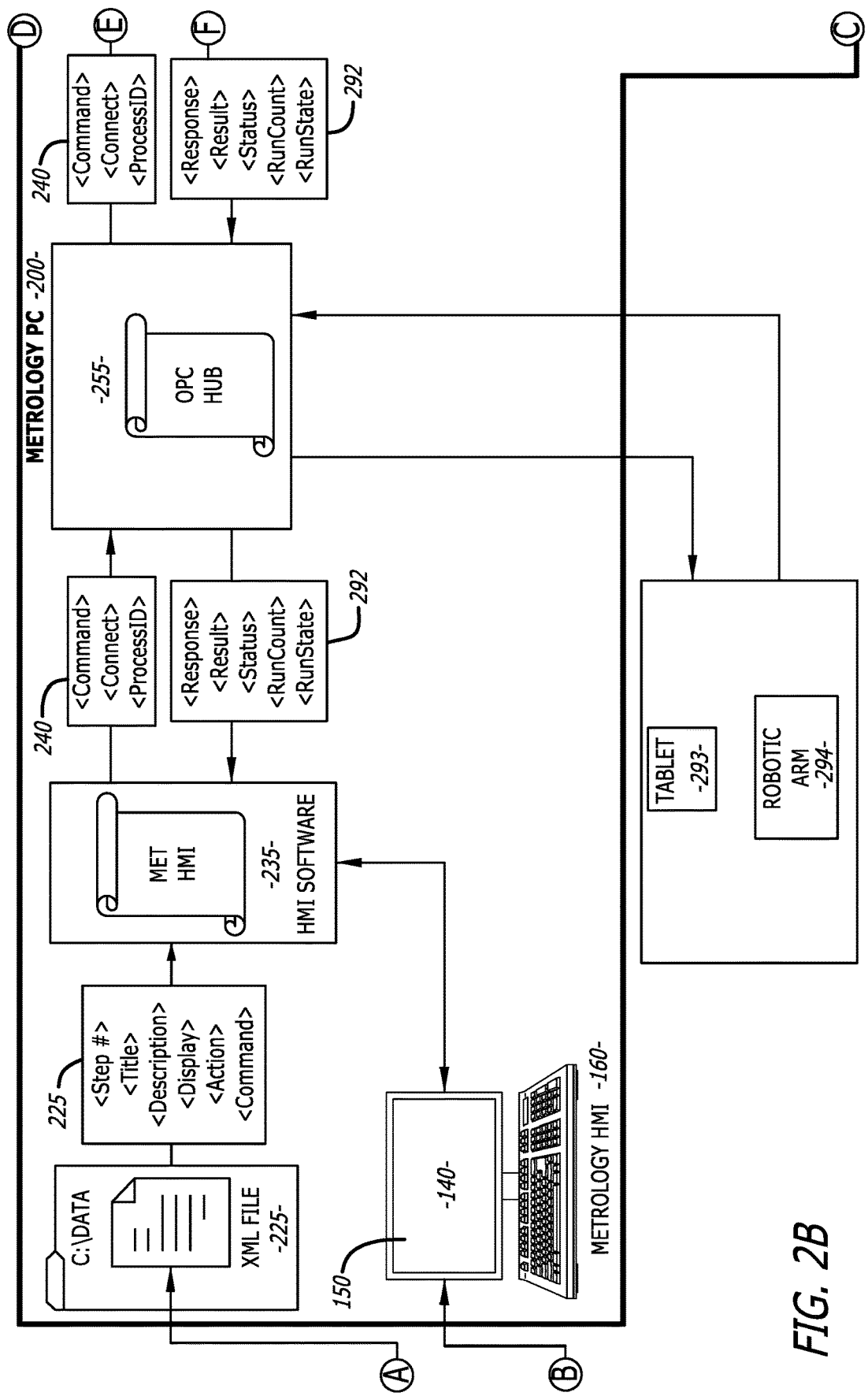

During operation of the disclosed ISMetS 100, a manufacturing engineer (refer to 210 in FIG. 2A) uploads at least one metrology extensible markup file (XML) file (e.g., refer to 300 of FIG. 3) to at least one metrology processor (e.g., a server and/or personal computer (PC)) (e.g., refer to 200 in FIG. 2B). It should be noted that the metrology processor(s) 200 may be located on the metrology HMI 160 itself or at another remote location (e.g., on a server). Each metrology XML file may contain at least one metrology action (e.g., a specific measurement action) for the metrology instrument (e.g., laser tracker) 110 to measure the manufactured object (e.g., aircraft) 120.

The metrology processor(s) 200, by using the metrology XML file(s), displays a GUI 140 (e.g., refer to 400 in FIG. 4A) on a display 150 of the metrology HMI 160, where the GUI 140 comprises at least one metrology action (e.g., refer to 420 of FIG. 4A) for the mechanic technician 130 to choose. The mechanic technician 130 then chooses at least one metrology action to be performed by selecting the desired metrology action(s) on the GUI 140 by using a mouse 170 or by using the display 150 itself (e.g., if the display 150 is a touchscreen display).

After a metrology action(s) has been selected by the mechanic technician 130 via the GUI 140, the metrology processor(s) 200 processes the metrology XML file(s) to ultimately generate at least one metrology instrument command file for that selected metrology action(s). The metrology instrument command file(s) commands the laser tracker metrology instrument 110 to measure the manufactured object 120 (e.g., by measuring the position of at least one optical target 180 mounted on the manufactured object 120) to obtain measurements of the manufactured object 120. During the measurements, the laser tracker metrology instrument 110 transmits a signal to the optical target(s) 180. The signal(s) is reflected off of the optical target(s) 180, and a reflected signal(s) is received by the laser tracker metrology instrument 110.

The metrology processor(s) 200 processes the received reflected signal(s) to determine the measurements of the manufactured object 120. The metrology processor(s) 200 then displays the determined measurements of the manufactured object 120 on the GUI 140 (e.g. refer to 480 in FIG. 4B) to the mechanic technician 130.

Figure 2C:
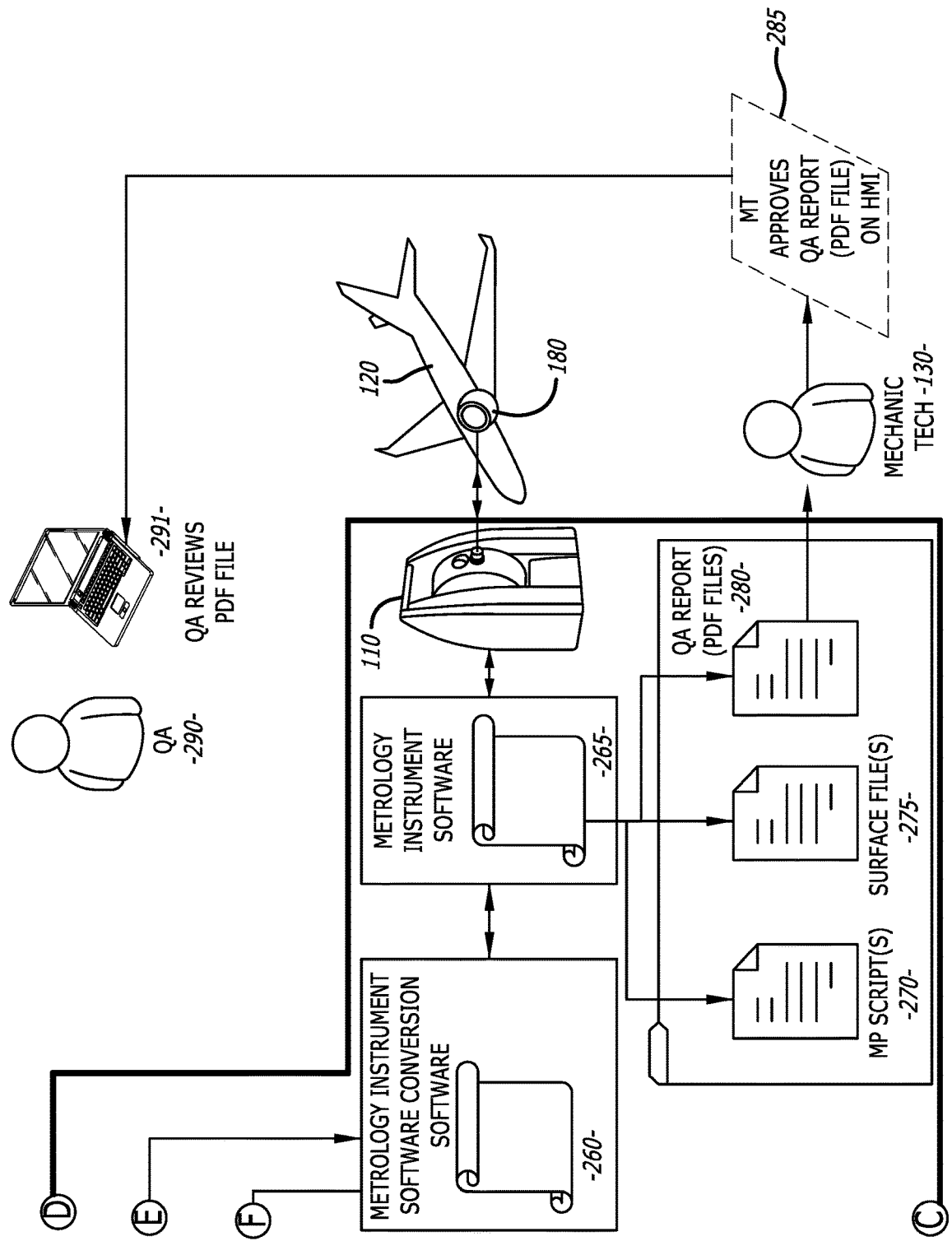

FIGS. 2A, 2B, and 2C are diagrams that together show the details of the disclosed integrated standardized metrology system (ISMetS) 100, in accordance with at least one embodiment of the present disclosure. During operation of the disclosed ISMetS 100, a manufacturing engineer (ME) 210 uploads 205 at least one metrology XML file 225 (e.g., refer to 300 of FIGS. 3) to 215 at least one metrology processor (e.g., a metrology server or personal computer (PC)) 200. The metrology processor(s) 200 may be located on the metrology HMI 160 itself and/or at another location (e.g., on a server). Each metrology XML file 225 may contain at least one metrology action (e.g., a specific measurement action) for the metrology instrument (e.g., laser tracker) 110 to measure the manufactured object (e.g., aircraft) 120. For example, each XML file 225 may comprise a step number (e.g., <Step #>) to indicate the specific step number for a metrology action, a title (e.g., <Title>) to indicate the title of the metrology action, a description (e.g., <Description>) to describe the details of the metrology action, a display indicator (e.g., <Display>) to indicate which display (e.g., display 150 of metrology HMI 160 or display 230 of mobile device (e.g., tablet) 220) to display a GUI 140 comprising the metrology action, an action (e.g., <Action>) to indicate an action (e.g., a calculation) for the metrology processor(s) 200 to perform, and a command (e.g., <Command>) to indicate a command to be performed (e.g., a command for the metrology instrument 110 to take measurements of the manufactured object 120). In addition, the manufacturing engineer 210 uploads 212 links, which are associated with the metrology action(s) contained within the metrology XML files 225, to a mobile device (e.g., a tablet or a smart phone) 220, which is utilized by a mechanic technician 130.

After the metrology XML files 225 are uploaded to the metrology processor(s) 200, the metrology processor(s) 200 translates, by utilizing human machine interface (HMI) software (e.g., commercial off the shelf (COTS) software, such as WINDOWS CONTROL CENTER OPEN ARCHITECTURE™ (WinCC OA) software) 235, the metrology XML file(s) 225 into a HMI metrology file(s). The metrology processor(s) 200 then generates, by utilizing the HMI software 235, a graphical user interface (GUI) 140 based on the HMI metrology file(s). Then, the metrology processor(s) 200 displays, by utilizing the HMI software 225, the GUI 140 on a display 150 of the metrology HMI 160. In some embodiments, the metrology processor(s) 200 displays, by utilizing the HMI software 225, the links, which are associated with the metrology action(s) contained within the metrology XML file(s), on the display 230 of the mobile device (e.g., a tablet or a smart phone) 220.

After the GUI 140 is displayed on a display 150 of the metrology HMI 160 and/or on the display 230 of the mobile device 220, the mechanic technician 130 chooses at least one metrology action to be performed by selecting 245 the desired metrology action(s) displayed on the GUI 140 by using a mouse (e.g., refer to 170 of FIG. 1) or by using the display 150 itself (e.g., if the display 150 is a touchscreen display) of the metrology HMI 160 and/or by selecting 250 the link(s) associated with the desired metrology action(s) by using the display 230 (e.g., a touchscreen display) of the mobile device 220 (or any other selection technique, e.g., utilizing voice or the like).

After the mechanic technician 130 chooses at least one metrology action to be performed, the metrology processor(s) 200 receives, by utilizing the HMI software 235, at least one command from the mechanic technician 130 via the GUI 140 (and/or via the link) to perform the selected metrology action(s) for the metrology instrument 110. The metrology processor(s) then generates, by utilizing the HMI software 235, a HMI metrology command file(s) 240 according to the command(s) from the mechanic technician 130 via the GUI 140 and/or via a link(s). For example, each generated HMI metrology command file 240 may comprise a command (e.g., <Command>) to indicate a command (e.g., a measurement of the manufactured object 120) for the metrology instrument 110 to perform, a connect indicator (e.g., <Connect>), and a process identification indicator (e.g. <ProcessID>).

In some embodiments, the HMI metrology command file(s) 240 is then passed through an open platform communications (OPC) hub (or router) 255. At least one metrology processor(s) 200 then translates, by utilizing metrology instrument software conversion software 260, the HMI metrology command files(s) 240 into at least one metrology instrument software command file(s).

The metrology instrument software conversion software 260 comprises a library (or database) for converting all of the various different commands, connect indicators, and process identifications of the HMI metrology command file(s) 240 that would ever be utilized for the system into commands for the metrology instrument software command file(s), which are readable by the metrology instrument software (e.g., COTS software, such as SPATIAL ANALYZER™ software) 265. The library (or database) of the metrology instrument software conversion software 260 allows for the system to employ the use of XML files 225 for the metrology process, and the XML files 225 allow for an efficient and faster way to dynamically operate the metrology instrument 110 (e.g., to take measurements of manufactured object 120).

Then, at least one metrology processor(s) 200 translates, by utilizing metrology instrument software (e.g., COTS software, such as SPATIAL ANALYZER™ software) 265, the metrology instrument software command file(s) into at least one metrology instrument command file (e.g. a measurement plan (MP) script(s)) 270 and into at least one computer-aided design file (e.g., a surface file(s)) 275 for the manufactured object 120. It should be noted that the metrology instrument software 265 comprises a metrology instrument driver(s) and metrology analysis software.

The metrology instrument 110 then measures the manufactured object 120, according to the metrology instrument command file(s) 270, to obtain measurements for the manufactured object 120. In particular, the metrology instrument command file(s) 270 commands the laser tracker metrology instrument 110 to measure the manufactured object 120 (e.g., by measuring the position of at least one optical target 180 mounted on the manufactured object 120) to obtain measurements of the manufactured object 120. During the measurements, the laser tracker metrology instrument 110 transmits a signal(s) to the optical target(s) 180. The signal(s) is reflected off of the optical target(s) 180, and a reflected signal(s) is received by the laser tracker metrology instrument 110.

After the metrology instrument 110 has received the reflected signal(s), the metrology instrument 110 generates, by using the reflected signal(s), at least one metrology results file comprising the measurements for the manufactured object 120. Then, the metrology processor(s) generates, by utilizing the metrology instrument software 265, measurement data for the manufactured object 120 by using the metrology results file(s) and by optionally using the computer-aided design file(s) (e.g., a surface file(s)) 275 for the manufactured object 120. In one or more embodiments, the measurement data comprises (1) the measurements for the manufactured object 120 and/or (2) discrepancies between the measurements for the manufactured object 120 and predetermined nominal measurements for the manufactured object 120.

Then, the metrology processor(s) generates, by utilizing the metrology instrument software 265, a quality assurance (QA) report 280 (e.g., which may be in the form of at least one portable document format (PDF) file) based on the measurement data. The mechanic technician 130 then reviews the QA report 280, which may be performed on the metrology HMI 160. If the mechanic technician 130 determines that the measurements of the manufactured object 120 are within allowable margins of deviations from the predetermined nominal measurements, the mechanic technician 130 will approve the QA report 280, which may be approved via the metrology HMI 160. After the mechanic technician 130 has approved the QA report 280, a QA engineer 290 will review 291 the QA report 280 for a final review.

The metrology processor(s) 200 generates, by utilizing the metrology instrument software 265, at least one metrology instrument software measurement data file based on the measurement data. Then, the metrology processor(s) 200 translates, by utilizing the metrology instrument software conversion software 260, the metrology instrument software measurement data file(s) into at least one HMI measurement data file 292. For example, each HMI measurement data file(s) 292 may comprise a response indicator (e.g., <Response>), a result indicator (e.g. <Result>), a status indicator (e.g., <Status>), a run count indicator (e.g. <RunCount>), and a run state indicator (e.g. <RunState>).

In some embodiments, the HMI measurement data file(s) 292 is then passed through the OPC hub (or router) 255. Then, the metrology processor(s) 200 displays, by utilizing HMI software 235 to process the HMI measurement data file(s) 292, at least a portion of the measurement data on the GUI 140 (e.g., refer to 480 of FIG. 4B) on the display 150 of the metrology HMI 160 and/or on the display 230 of the mobile device 220.

In one or more embodiments, the QA report 280 is displayed on the GUI 140 on the display 150 of the metrology HMI 160 and/or on the display 230 of the mobile device 220. For these embodiments, the mechanic technician 130 may approve the QA report 280 by approving the QA report 280 on the GUI 140 by using the mouse (e.g., refer to 170 of FIG. 1) or by using the display 150 itself (e.g., if the display 150 is a touchscreen display) of the metrology HMI 160 and/or by using the display 230 (e.g., a touchscreen display) of the mobile device 220.

In some embodiments, when the measurements of the manufactured object 120 are not within the allowable margins of deviations from the predetermined nominal measurements, the mechanic technician 130 may choose to adjust a physical position of at least a portion of the manufactured object 120 so that the measurements of the manufactured object 120 will be within the allowable margins of deviations from the predetermined nominal measurements. The mechanic technician 130 may do so by selecting at least a portion of the manufactured object 120 to be physically adjusted on the GUI 140 by using the mouse (e.g., refer to 170 of FIG. 1) or by using the display 150 itself (e.g., if the display 150 is a touchscreen display) of the metrology HMI 160 and/or by using the display (e.g., a touchscreen display) of a mobile device (e.g. a tablet or a smart phone) 293. After the mechanic technician 130 has selected at least a portion of the manufactured object 120 to be physically adjusted, the metrology processor(s) 200 automates, by utilizing the HMI software 235 to process the HMI measurement data file(s) 292, tooling (e.g., a robotic arm, tooling vehicle, support structure, or the like) 294 to adjust a physical position of at least a portion of the manufactured object 120 according to the measurement data so that subsequent measurements of the manufactured object 120 will be within the allowable margins of deviations from the predetermined nominal measurements.

FIG. 3 is a diagram showing an exemplary extensible markup language (XML) file 300 that may be employed for the disclosed integrated standardized metrology system (ISMetS), in accordance with at least one embodiment of the present disclosure. In this figure, the exemplary XML file 300 is shown to include multiple script modules, which each comprise a step number (e.g., <Step #>) to indicate the specific step number for a metrology action, a title (e.g., <Title>) to indicate the title of the metrology action, a description (e.g., <Description>) to describe the details of the metrology action, a display indicator (e.g., <Display>) to indicate which display (e.g., display 150 of metrology HMI 160 or mobile device (e.g., tablet) 220) to display a GUI 140 comprising the metrology action, an action (e.g., <Action>) to indicate an action (e.g., a calculation) for the metrology processor(s) 200 to perform, and a command (e.g., <Command>) to indicate a command (e.g., a measurement of the manufactured object 120) for the metrology instrument 110 to perform.

Figure 4A:
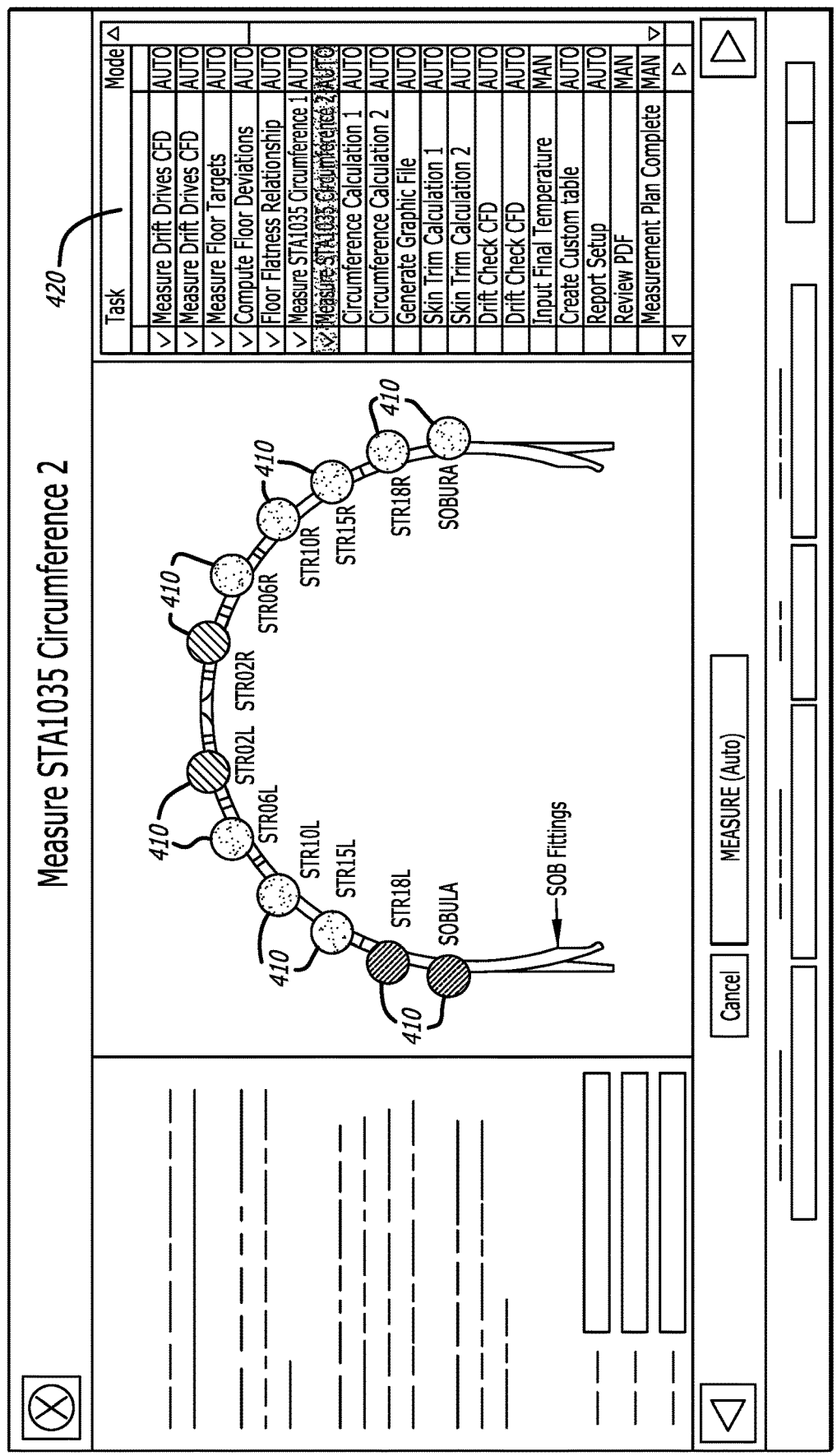
FIGS. 4A and 4B show exemplary graphical user interfaces (GUIs) that may be employed for the human machine interface (HMI) of the disclosed integrated standardized metrology system (ISMetS), in accordance with at least one embodiment of the present disclosure.
Figure 4B:
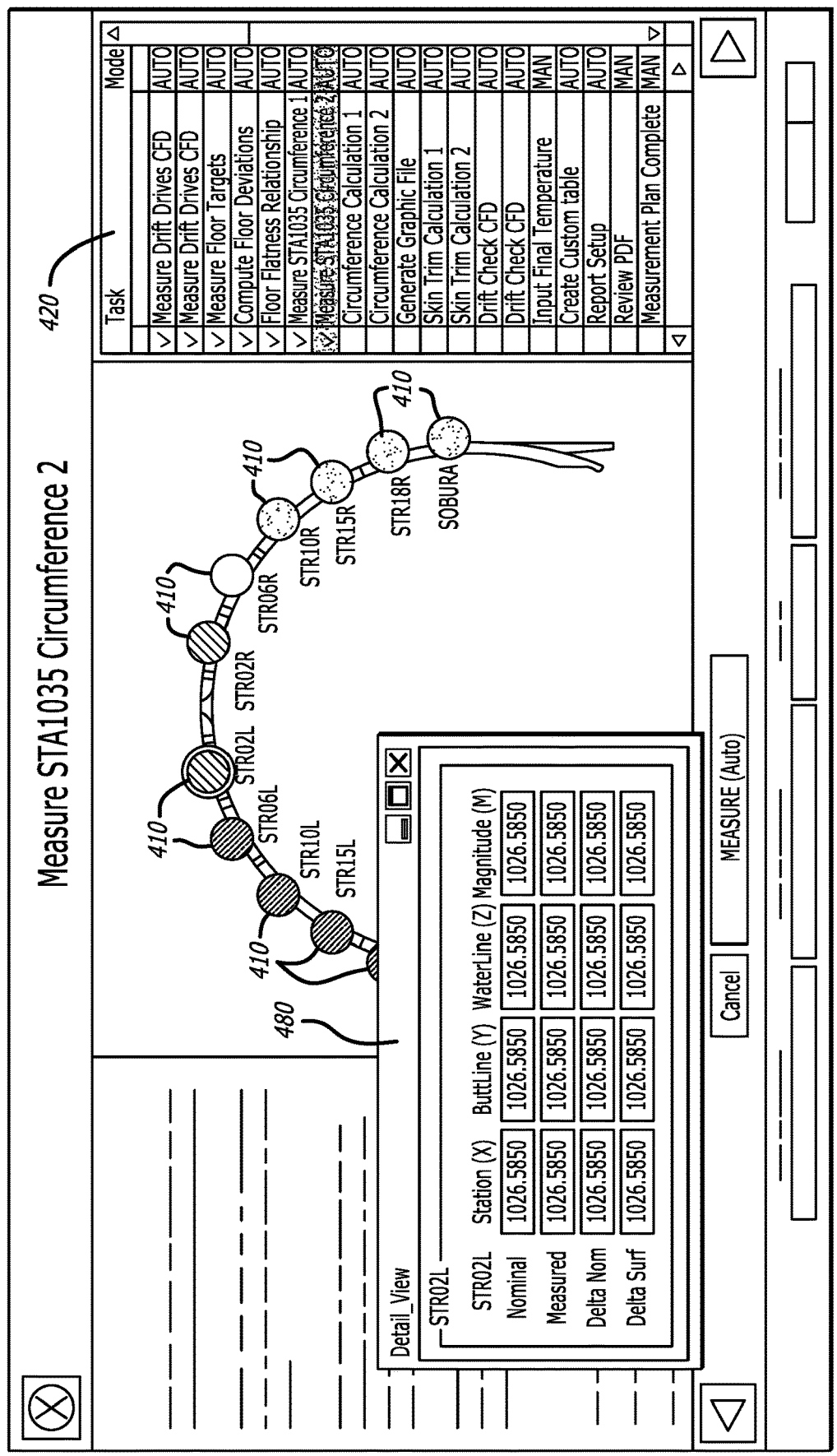

FIGS. 4A and 4B show exemplary graphical user interfaces (GUIs) 400, 450 that may be employed for the human machine interface (HMI) of the disclosed integrated standardized metrology system (ISMetS), in accordance with at least one embodiment of the present disclosure. In these figures, a plurality of optical targets 410, which are physically mounted on the manufactured object 120, are displayed on the GUIs 400, 450. In the right-hand margin of the GUIs 400, 450, a plurality of available metrology actions 420 are listed.

During operation of the disclosed ISMetS, a mechanic technician 130 may choose at least one of the metrology actions 420 to be performed by selecting the desired metrology action(s) on the GUI 400. After the metrology instrument 110 has taken the measurements of the manufactured object 120 according to the selected metrology action(s) 420, the determined measurements 480 of the manufactured object 120 are displayed on the GUI 450 to the mechanic technician 130 for review.

FIGS. 5A, 5B, and 5C together are a flow chart showing the disclosed method for an integrated standardized metrology system (ISMetS), in accordance with at least one embodiment of the present disclosure. At the start 500 of the method, at least one processor receives an extensible markup language (XML) metrology file, where the XML metrology file comprises at least one metrology action for a metrology instrument to measure at least one object 505. Then, at least one processor, by utilizing human machine interface (HMI) software, translates the XML metrology file into a HMI metrology file 510. At least one processor then, by utilizing the HMI software, generates a graphical user interface (GUI) based on the HMI metrology file 515. Then, at least one processor, by utilizing the HMI software, displays the GUI on a display 520.

At least one processor then, by utilizing the HMI software, receives a command from a user via the GUI to perform at least one of the metrology actions for the metrology instrument 525. Then, at least one processor, by utilizing the HMI software, generates a HMI metrology command file according to the command from the user 530.

Then, at least one processor, by using metrology instrument software conversion software, translates the HMI metrology command file into a metrology instrument software command file 535. At least one processor then, by utilizing the metrology instrument software, translates the metrology instrument software command file into a metrology instrument command file 540. Then, the metrology instrument measures at least one object, according to the metrology instrument command file, to obtain measurements for at least one object 545. The metrology instrument then generates a metrology results file comprising the measurements for at least one object 550.

Then, at least one processor, by utilizing the metrology instrument software, generates measurement data by using the metrology results file 555. In one or more embodiments, the measurement data comprises the measurements for at least one object and discrepancies between the measurements for at least one object and predetermined nominal measurements for at least one object. At least one processor then, by utilizing the metrology instrument software, generates a quality assurance (QA) report based on the measurement data 560.

Then, at least one processor, by utilizing the metrology instrument software, generates a metrology instrument software measurement data file based on the measurement data 565. At least one processor then, by utilizing the metrology instrument software, generates a metrology instrument software measurement data file based on the measurement data 565. Then, at least one processor, by utilizing the metrology instrument software conversion software, translates the metrology instrument software measurement data file into a HMI measurement data file 570. At least one processor then, by utilizing the HMI software by using the HMI measurement data file, displays at least a portion of the measurement data on the GUI of the display 575. Then, at least one processor, by utilizing the HMI software by using the HMI measurement data file, automates tooling to adjust a position of at least one of the objects according to the measurement data 580. Then, the method ends 585.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for operation of a metrology system, the method comprising:
    receiving, by at least one processor, an extensible markup language (XML) metrology file, wherein the XML metrology file comprises at least one metrology action for a metrology instrument to measure at least one object;
    translating, by the at least one processor, the XML metrology file into a human machine interface (HMI) metrology file;
    generating, by the at least one processor, a graphical user interface (GUI) based on the HMI metrology file;
    generating, by the at least one processor, a HMI metrology command file according to a command from a user via the GUI;
    translating, by the at least one processor, the HMI metrology command file into a metrology instrument software command file;
    translating, by the at least one processor, the metrology instrument software command file into a metrology instrument command file; and
    measuring, by the metrology instrument, the at least one object, according to the metrology instrument command file, to obtain measurements for the at least one object.

2. The method of claim 1, wherein the method further comprises displaying, by the at least one processor, the GUI on a display.

3. The method of claim 1, wherein the method further comprises receiving, by the at least one processor, the command from the user via the GUI to perform at least one of the metrology actions for the metrology instrument.

4. The method of claim 1, wherein the method further comprises generating, by the metrology instrument, a metrology results file comprising the measurements for the at least one object.

5. The method of claim 4, wherein the method further comprises generating, by the at least one processor, measurement data by using the metrology results file,
    wherein the measurement data comprises at least one of the measurements for the at least one object or discrepancies between the measurements for the at least one object and predetermined nominal measurements for the at least one object.

6. The method of claim 5, wherein the method further comprises generating, by the at least one processor, a quality assurance (QA) report based on the measurement data.

7. The method of claim 5, wherein the method further comprises generating, by the at least one processor, a metrology instrument software measurement data file based on the measurement data.

8. The method of claim 7, wherein the method further comprises translating, by the at least one processor, the metrology instrument software measurement data file into a HMI measurement data file.

9. The method of claim 8, wherein the method further comprises displaying, by the at least one processor by using the HMI measurement data file, at least a portion of the measurement data on the GUI on the display.

10. The method of claim 8, wherein the method further comprises automating, by the at least one processor by using the HMI measurement data file, tooling to adjust a position of at least one of the objects according to the measurement data.

11. A metrology system, the system comprising:
at least one processor to:
receive an extensible markup language (XML) metrology file, wherein the XML metrology file comprises at least one metrology action for a metrology instrument to measure at least one object,
translate the XML metrology file into a human machine interface (HMI) metrology file,
generate a graphical user interface (GUI) based on the HMI metrology file,
generate a HMI metrology command file according to a command from a user via the GUI,
translate the HMI metrology command file into a metrology instrument software command file,
translate the metrology instrument software command file into a metrology instrument command file; and
the metrology instrument to measure the at least one object, according to the metrology instrument command file, to obtain measurements for the at least one object.

12. The system of claim 11, wherein the at least one processor is further to display the GUI on a display.

13. The system of claim 11, wherein the at least one processor is further to receive the command from the user via the GUI to perform at least one of the metrology actions for the metrology instrument.

14. The system of claim 11, wherein the metrology instrument is further to generate a metrology results file comprising the measurements for the at least one object.

15. The system of claim 14, wherein the at least one processor is further to generate measurement data by using the metrology results file,
wherein the measurement data comprises at least one of the measurements for the at least one object or discrepancies between the measurements for the at least one object and predetermined nominal measurements for the at least one object.

16. The system of claim 15, wherein the at least one processor is further to generate a quality assurance (QA) report based on the measurement data.

17. The system of claim 15, wherein the at least one processor is further to generate a metrology instrument software measurement data file based on the measurement data.

18. The system of claim 17, wherein the at least one processor is further to translate the metrology instrument software measurement data file into a HMI measurement data file.

19. The system of claim 18, wherein the at least one processor is further to display, by using the HMI measurement data file, at least a portion of the measurement data on the GUI on the display.

20. The system of claim 18, wherein the at least one processor is further to automate, by using the HMI measurement data file, tooling to adjust a position of at least one of the objects according to the measurement data.

* * * * *